United States Patent
Yu et al.

(10) Patent No.: US 6,689,671 B1
(45) Date of Patent: Feb. 10, 2004

(54) LOW TEMPERATURE SOLID-PHASE EPITAXY FABRICATION PROCESS FOR MOS DEVICES BUILT ON STRAINED SEMICONDUCTOR SUBSTRATE

(75) Inventors: Bin Yu, Cupertino, CA (US); Derick J. Wristers, Bee Caves, TX (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 36 days.

(21) Appl. No.: 10/151,946

(22) Filed: May 22, 2002

(51) Int. Cl.$^7$ .......................... H01L 21/20; H01L 21/36
(52) U.S. Cl. .................................................. 438/486
(58) Field of Search ........................ 438/486, 478–485, 438/487, 491, 507–509

(56) References Cited

U.S. PATENT DOCUMENTS

| | | | |
|---|---|---|---|
| 3,269 A | 9/1843 | Ely | |
| 8,284 A | 8/1851 | Gregg | |
| 16,383 A | 1/1857 | Fitch | |
| 24,884 A | 7/1859 | Morris | |
| 5,565,690 A | * 10/1996 | Theodore et al. | 257/18 |
| 5,759,898 A | 6/1998 | Ek et al. | |
| 5,953,615 A | 9/1999 | Yu | |
| 6,039,803 A | 3/2000 | Fitzgerald et al. | |
| 6,180,476 B1 | 1/2001 | Yu | |
| 6,180,490 B1 | 1/2001 | Vassiliev et al. | |
| 6,207,530 B1 | 3/2001 | Hsu et al. | |
| 6,214,653 B1 | 4/2001 | Chen et al. | |
| 6,251,751 B1 | 6/2001 | Chu et al. | |
| 6,300,172 B1 | 10/2001 | Ang et al. | |
| 6,313,486 B1 | 11/2001 | Kencke et al. | |

OTHER PUBLICATIONS

Yeo et al. "Nanoscale Ulta–thin–body silicon–on–insulator P–MOSFET with a SiGe/Si Heterostructure channel" IEEE Electron Device Letters vol. 21, No. 4, Apr. 2000.*

* cited by examiner

*Primary Examiner*—Craig Thompson

(57) ABSTRACT

A method of manufacturing a semiconductor device, comprising steps of:
(a) providing a semiconductor substrate comprising a strained lattice semiconductor layer at an upper surface thereof and having a pre-selected amount of lattice strain;
(b) forming a device structure in the semiconductor substrate by a process comprising forming at least one amorphous region in at least one portion of the strained lattice semiconductor layer; and
(c) thermal annealing at a minimum temperature sufficient to effect epitaxial re-crystallization of the at least one amorphous region to re-form a strained lattice semiconductor layer having substantially the pre-selected amount of lattice strain, whereby strain relaxation of the strained lattice semiconductor arising from thermal annealing is substantially eliminated or minimized.

12 Claims, 2 Drawing Sheets

LOW TEMPERATURE SOLID-PHASE EPITAXY FABRICATION PROCESS FOR MOS DEVICES BUILT ON STRAINED SEMICONDUCTOR SUBSTRATE

FIELD OF THE INVENTION

The present invention relates generally to the manufacture of high speed MOS semiconductor devices fabricated on strained lattice semiconductor substrates, and devices obtained thereby. Specifically, the present invention relates to an improved method of performing thermal annealing of amorphized and dopant-implanted regions of strained lattice semiconductor layers for effecting epitaxial re-crystallization thereof and dopant activation, without incurring significant stress relaxation of the strained lattice.

BACKGROUND OF THE INVENTION

Recently, there has been much interest in various approaches with the aim or goal of developing new semiconductor materials which provide increased speeds of electron and hole flow therethrough, thereby permitting fabrication of semiconductor devices, such as integrated circuit (IC) devices with higher operating speeds, enhanced performance characteristics, and lower power consumption. One such material which shows promise in attaining the goal of higher device operating speeds is termed "strained silicon".

According to this approach, a very thin, tensilely strained, crystalline silicon (Si) layer is grown on a relaxed, graded composition Si—Ge buffer layer several microns thick, which Si—Ge buffer layer in turn is formed on a suitable crystalline substrate, e.g., a Si wafer or a silicon-on-insulator (SOI) wafer. Strained Si technology is based upon the tendency of the Si atoms, when deposited on the Si—Ge buffer layer, to align with the greater lattice constant (spacing) of the Si and Ge atoms therein (relative to pure Si). As a consequence of the Si atoms being deposited on a substrate (Si—Ge) comprised of atoms which are spaced further apart, they "stretch" to align with the underlying Si and Ge atoms, thereby "stretching" or tensilely straining the deposited Si layer. Electrons and holes in such strained Si layers have greater mobility than in conventional, relaxed Si layers with smaller inter-atom spacings, i.e., there is less resistance to electron and/or hole flow. For example, electron flow in strained Si may be up to about 70% faster compared to electron flow in conventional Si. Transistors and IC devices formed with such strained Si layers can exhibit operating speeds up to about 35% faster than those of equivalent devices formed with conventional Si, without necessity for reduction in transistor size.

However, an important concern in the manufacture of practical semiconductor devices utilizing strained semiconductor layers, e.g., strained Si layers, is the requirement for maintaining the tensilely strained condition of the strained semiconductor layer throughout device processing, without incurring significant strain relaxation disadvantageously leading to reduction in electron/hole mobility resulting in degradation in device performance characteristics. For example, many device fabrication steps, including for example, annealing for re-crystallization of amorphized regions and activation of implanted dopant species, frequently involve high temperature processing at temperatures on the order of about 900–1,100° C. for intervals sufficient to result in significant relaxation in the tensile strain of the Si layer, which in turn results in a lowering of the electron and hole mobilities therein to values comparable to those of conventional Si layers, whereby the potential advantages attributable to enhanced electron/hole mobility in the strained Si layer are partially or wholly lost.

Accordingly, there exists a need for improved methodology for fabrication of semiconductor devices with strained semiconductor layers, notably strained Si layers, which substantially eliminates, or at least minimizes, deleterious stress relaxation during device processing at elevated temperatures, e.g., as in thermal annealing processing for re-crystallization and dopant activation of amorphized, dopant-implanted source and drain regions forming part of MOS-type transistors and CMOS devices.

The present invention, wherein thermal annealing processing for re-crystallization and dopant activation of amorphized, dopant-implanted source and drain regions forming part of MOS-type transistors and CMOS devices is performed at a minimum temperature sufficient to cause epitaxial re-crystallization of amorphous, dopant-implanted region in a strained lattice semiconductor layer to re-form an epitaxial, strained lattice semiconductor layer having substantially the original amount of lattice strain, effectively eliminates, or at least minimizes, disadvantageous strain relaxation of the strained lattice semiconductor arising from the thermal annealing. As a consequence, the inventive methodology facilitates manufacture of high speed, high performance, reduced power consumption semiconductor devices utilizing strained semiconductor technology. Further, the methodology afforded by the present invention enjoys diverse utility in the manufacture of numerous and various semiconductor devices and/or components therefor which require use of strained semiconductor technology for enhancement of device speed and lower power consumption.

DISCLOSURE OF THE INVENTION

An advantage of the present invention is an improved method for manufacturing a semiconductor device comprising a strained lattice semiconductor layer.

Another advantage of the present invention is an improved method for manufacturing a semiconductor device comprising epitaxial re-crystallization of an amorphous, dopant-implanted region of a strained lattice semiconductor layer without incurring significant stress relaxation.

Yet another advantage of the present invention is an improved method for manufacturing high-speed MOS-type semiconductor devices comprising strained lattice semiconductor layers.

Still another advantage of the present invention is improved, high-speed MOS-type semiconductor devices fabricated on or within substrates including strained lattice semiconductor layers.

Additional advantages and other aspects and features of the present invention will be set forth in the description which follows and in part will become apparent to those having ordinary skill in the art upon examination of the following or may be learned from the practice of the present invention. The advantages of the present invention may be realized and obtained as particularly pointed out in the appended claims.

According to the invention, the foregoing and other advantages are obtained in part by a method of manufacturing a semiconductor device, comprising the steps of:

(a) providing a semiconductor substrate comprising a strained lattice semiconductor layer at an upper surface thereof, the strained lattice semiconductor layer having a pre-selected amount of lattice strain therein;

(b) forming a device structure in the semiconductor substrate by a process comprising forming at least one amorphous region in at least one portion of the strained lattice semiconductor layer; and (c) thermal annealing the device structure at a minimum temperature sufficient to effect epitaxial re-crystallization of the at least one amorphous region in the strained lattice semiconductor layer to re-form a strained lattice semiconductor layer having substantially the pre-selected amount of lattice strain, whereby strain relaxation of the strained lattice semiconductor arising from the thermal annealing is substantially eliminated or minimized.

According to embodiments of the present invention, step (b) further comprises implanting a dopant species in the at least one amorphous region; and step (c) further comprises simultaneously epitaxial re-crystallizing the at least one amorphous region in the strained lattice semiconductor layer and activating the implanted dopant species therein.

In accordance with further embodiments of the present invention:

step (a) comprises providing a semiconductor substrate comprising a crystalline semiconductor layer below the strained lattice semiconductor layer;

step (b) still further comprises forming at least one amorphous region in at least one portion of the crystalline semiconductor layer and implanting a dopant species therein; and step (c) still further comprises simultaneously epitaxial re-crystallizing the at least one amorphous region in the strained lattice semiconductor layer and activating the implanted dopant species therein, and re-crystallizing the at least one amorphous region in the at least one portion of the crystalline semiconductor layer and activating the implanted dopant species therein.

According to certain embodiments of the present invention, step (c) comprises performing laser thermal annealing (LTA) or rapid thermal annealing (RTA).

Embodiments of the invention include, as step (b), forming a PMOS transistor, an NMOS transistor, or a CMOS device, wherein:

step (a) comprises providing a semiconductor substrate including a crystalline, graded composition silicon-germanium (Si—Ge) layer, with a lattice-matched crystalline silicon (Si) layer on a first side of the Si—Ge layer and comprising the strained lattice semiconductor layer.

According to further embodiments of the present invention:

step (a) comprises providing a semiconductor substrate which further includes a crystalline silicon layer on a second, opposite side of the Si—Ge layer;

step (b) comprises sequential steps of:
  i. forming at least one gate oxide layer/gate electrode stack on at least one surface portion of the Si strained lattice semiconductor layer;
  ii. performing a pre-amorphization implantation of the Si strained lattice semiconductor layer utilizing the at least one gate oxide layer/gate electrode layer stack as an implantation mask, to form at least one pair of amorphous regions in the Si strained lattice semiconductor layer aligned with opposite side edges of the gate oxide layer/gate electrode layer stack; and
  iii. implanting dopant species of one conductivity type in the at least one pair of amorphous regions in the Si strained lattice semiconductor layer utilizing the gate oxide layer/gate electrode layer stack as an implantation mask; and step (c) comprises thermal annealing the device structure to simultaneously re-crystallize the at least one pair of amorphous regions in the Si strained lattice semiconductor layer and activate the implanted dopant species therein.

In accordance with embodiments of the present invention:

step (a) comprises providing a semiconductor substrate with a Si strained lattice semiconductor layer having a pre-selected thickness; and steps (b) and (c) together form at least one pair of source/drain extension regions vertically aligned with side edges of the gate oxide layer/gate electrode layer stack and extending in the Si strained lattice semiconductor layer to a depth above and proximate an interface between the Si strained lattice semiconductor layer and the graded composition Si—Ge layer.

According to further embodiments of the present invention:

step (b) further comprises sequential steps of:
  iv. forming sidewall spacers on opposite side edge surfaces of the at least one gate oxide layer/gate electrode layer stack;
  v. performing a post-amorphization implantation of the Si—Ge layer utilizing the at least one gate oxide layer/gate electrode layer stack with the sidewall spacers thereon as an implantation mask, to form at least one pair of amorphous regions in the Si—Ge layer; and
  vi. implanting dopant species of the one conductivity type in the at least one pair of amorphous regions in the Si—Ge layer utilizing the at least one gate oxide layer/gate electrode layer stack with the sidewall spacers thereon as an implantation mask; and step (c) further comprises thermal annealing the device structure to simultaneously epitaxial re-crystallize the at least one pair of amorphous regions in the Si strained lattice semiconductor layer and activate the implanted dopant species therein, and to re-crystallize the at least one pair of amorphous regions in the Si—Ge layer and activate the implanted dopant species therein.

In accordance with certain embodiments of the present invention:

steps (b) and (c) together further form at least one pair of source/drain regions vertically aligned with the sidewall spacers on the side edges of the gate oxide layer/gate electrode layer stack and extending to a pre-selected depth in the Si—Ge layer.

Embodiments of the present invention include performing step (c) by laser thermal annealing (LTA) or rapid thermal annealing (RTA) at a temperature from about 500 to about 600° C. for from about 30 sec. to about 5 hrs. to simultaneously re-crystallize and activate implanted dopant species in each of the amorphous regions in the Si strained lattice semiconductor layer and the Si—Ge layer.

Another aspect of the present invention is a semiconductor device comprising a semiconductor substrate including a crystalline, strained lattice semiconductor layer at an upper surface thereof, the strained lattice semiconductor layer including at least one epitaxial recrystallized region formed by a thermal annealing process conducted at a minimum temperature sufficient to effect epitaxial re-crystallization of at least one amorphous region therein to re-form a crystalline, strained lattice semiconductor layer without incurring strain relaxation of the strained lattice semiconductor arising from the thermal annealing.

According to embodiments of the present invention, the at least one recrystallized region further comprises a dopant therein, and the semiconductor device comprises at least one MOS device which includes one or more of a PMOS transistor, an NMOS transistor, and a CMOS device.

In accordance with certain embodiments of the present invention, the semiconductor substrate includes a crystalline, graded composition silicon-germanium (Si—Ge) layer, with a lattice-matched crystalline silicon (Si) layer on a first side of the Si—Ge layer and comprising the strained lattice semiconductor layer, and a crystalline silicon layer on a second, opposite side of the Si—Ge layer.

According to embodiments of the present invention, the semiconductor device is formed according to a process comprising sequential steps of:

(a) forming at least one gate oxide layer/gate electrode stack on at least one surface portion of the Si strained lattice semiconductor layer, the Si strained semiconductor layer having a pre-selected amount of lattice strain therein;

(b) performing a pre-amorphization implantation of the Si strained lattice semiconductor layer utilizing the at least one gate oxide layer/gate electrode layer stack as an implantation mask, to form at least one pair of amorphous regions in the Si strained lattice semiconductor layer aligned with opposite side edges of the gate oxide layer/gate electrode layer stack; and (c) implanting dopant species of one conductivity type in the at least one pair of amorphous regions in the Si strained lattice semiconductor layer utilizing the gate oxide layer/gate electrode layer stack as an implantation mask; and (d) thermal annealing to simultaneously re-crystallize the at least one pair of amorphous regions in the Si strained lattice semiconductor layer and activate the implanted dopant species therein, the thermal annealing performed at a minimum temperature sufficient to effect epitaxial re-crystallization of the at least one pair of amorphous regions in the strained lattice semiconductor layer to re-form a strained lattice semiconductor layer having substantially the pre-selected amount of lattice strain, whereby strain relaxation of the strained lattice semiconductor arising from the thermal annealing is substantially eliminated or minimized; wherein: steps (b)–(d) form at least one pair of source/drain extension regions vertically aligned with side edges of the gate oxide layer/gate electrode layer stack and extending in the Si strained lattice semiconductor layer to a depth above and proximate an interface between the Si strained lattice semiconductor layer and the graded composition Si—Ge layer.

In accordance with further embodiments of the present invention, the semiconductor device is formed according to a process which further comprises sequential steps of:

(e) forming sidewall spacers on opposite side edge surfaces of the at least one gate oxide layer/gate electrode layer stack after step (c) and before step (d);

(f) performing a post-amorphization implantation of the Si—Ge layer utilizing the at least one gate oxide layer/gate electrode layer stack with the sidewall spacers thereon as an implantation mask, to form at least one pair of amorphous regions in the Si—Ge layer; and (g) implanting dopant species of the one conductivity type in the at least one pair of amorphous regions in the Si—Ge layer, utilizing the at least one gate oxide layer/gate electrode layer stack with the sidewall spacers thereon as an implantation mask; wherein:

step (d) further comprises thermal annealing to simultaneously epitaxial re-crystallize the at least one pair of amorphous regions in the Si strained lattice semiconductor layer and activate the inplanted dopant species therein, and to re-crystallize the at least one pair of amorphous regions in the Si—Ge layer and activate the implanted dopant species therein; and steps (d)–(g) form at least one pair of source/drain regions vertically aligned with the sidewall spacers on the side edges of the gate oxide layer/gate electrode layer stack and extending to a pre-selected depth in the Si—Ge layer.

According to certain embodiments of the present invention, step (c) comprises performing laser thermal annealing (LTA) or rapid thermal annealing (RTA) at a temperature from about 500 to about 600° C. for from about 30 sec. to about 5 hrs. to simultaneously re-crystallize and activate implanted dopant species in each of the amorphous regions in the Si strained lattice semiconductor layer and the Si—Ge layer.

Additional advantages and aspects of the present invention will become readily apparent to those skilled in the art from the following detailed description, wherein embodiments of the present invention are shown and described, simply by way of illustration of the best mode contemplated for practicing the present invention. As will be described, the present invention is capable of other and different embodiments, and its several details are susceptible of modification in various obvious respects, without departing from the spirit of the present invention. Accordingly, the drawings and description are to be regarded as illustrative in nature, and not as limitative.

BRIEF DESCRIPTION OF THE DRAWINGS

The following detailed description of the embodiments of the present invention can best be understood when read in conjunction with the following drawings, in which the various features are not necessarily drawn to scale but rather are drawn as to best illustrate the pertinent features and like reference numerals are employed throughout to designate similar features, wherein.

DESCRIPTION OF THE INVENTION

The present invention is based upon the discovery that formation of high quality, high speed semiconductor devices, e.g., MOS devices such as PMOS transistors, NMOS transistors, and CMOS devices, suitable for use in the manufacture of integrated circuit (IC) devices, can be readily fabricated on or within strained lattice semiconductor materials and substrates by means of a process which substantially eliminates, or at least minimizes, stress relaxation in the strained lattice semiconductor material arising from elevated temperature processing during device fabrication, which stress relaxation disadvantageously mitigates the benefit of increased electron and/or hole mobility, hence operating speed, attributed to the strained lattice.

A key feature of the present invention is performing thermal annealing of amorphized and dopant implanted regions of strained lattice semiconductor materials at temperatures substantially lower than those associated with conventional thermal annealing methodologies, e.g., rapid thermal annealing (RTA), and is based upon recognition by the inventors that such thermal annealing performed at lower-than-conventional RTA temperatures can effect simultaneous recrystallization of the amorphized regions and activation of dopant species implanted therein to reform the regions as source/drain regions of strained lattice semiconductor material having the same amount of lattice strain as the starting material. As a consequence of the inventive methodology, the advantages of increased charge carrier mobility, including increased device operating speed, attributable to the use of strained lattice semiconductor material, are retained, i.e., not lost or reduced as a result of lattice stress relaxation arising from thermal processing at elevated temperatures. Advantageously, the inventive methodology may be utilized in the manufacture of all manner of semiconductor devices fabricated on or within strained lattice semiconductor substrates, while maintaining full compatibility with all other aspects of process step sequences for the automated manufacture of semiconductor devices such as MOS-based transistors and CMOS devices.

Figure 1:
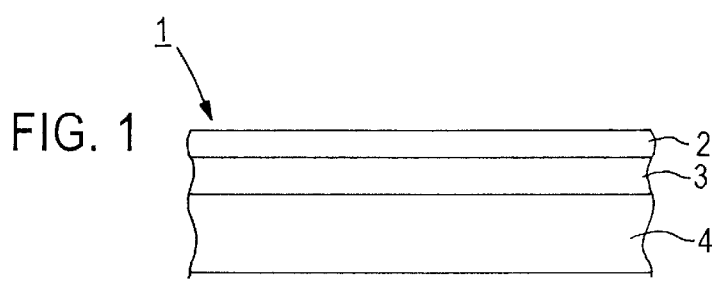
FIGS. 1–7 are schematic, simplified, cross-sectional views illustrating stages in a process for forming a MOS transistor according to an embodiment of the present invention.

Referring to FIGS. 1–7, shown therein are schematic, simplified, cross-sectional views illustrating stages in a process for forming a MOS transistor according to an embodiment of the present invention. With particular reference to FIG. 1, a substrate/workpiece 1 comprising a thin, strained lattice semiconductor layer 2 at an upper surface thereof is provided, which thin, strained lattice semiconductor layer 2 is lattice-matched to a relatively thicker, underlying crystalline semiconductor buffer layer 3 of different composition, the latter being in overlying contact with a suitable substrate 4. Typically, and by way of illustration only, the thin, strained lattice semiconductor layer 2 comprises a tensilely strained, crystalline Si layer from about 50 to about 200 Å thick, grown on a strain-relaxed, graded composition Si—Ge buffer layer 3 several $\mu$m thick, in turn formed on a suitable substrate 4, e.g., a crystalline Si wafer or a silicon-on-insulator (SOI) substrate. As indicated supra, when the Si atoms of the strained lattice semiconductor layer 2 are deposited on the Si—Ge buffer layer 3 in alignment with the greater lattice constant (spacing) of the Si and Ge atoms therein, relative to pure Si, the deposited Si atoms tend to "stretch" to align with the underlying lattice of Si and Ge atoms, thereby "stretching" or tensilely straining Si layer 2. Typical thicknesses of the graded composition Si—Ge buffer layers 3 range from about 500 Å to about 2 $\mu$m. Electron and/or hole mobilities in such Si strained lattice semiconductor layers 2 formed on Si—Ge buffer layers 3 can be as much as about 70% faster than in conventional, relaxed lattice Si, and transistors and IC devices formed therewith can be up to about 35% faster than equivalent devices formed with conventional Si, without any requirement for size reduction.

Figure 2:
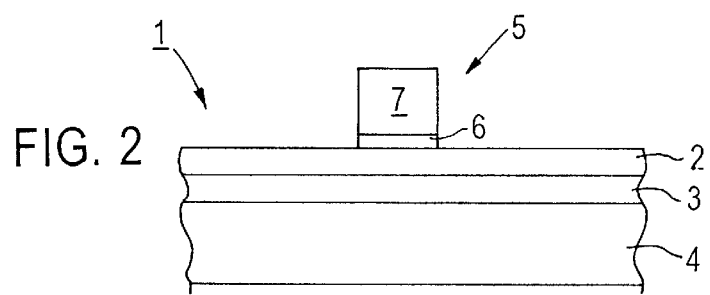

Adverting to FIG. 2, a gate layer stack 5, comprised of a thin gate insulator layer 6, typically a silicon oxide layer less than about 150 Å thick, and a relatively thicker, electrically conductive gate electrode layer 7, typically a doped polysilicon layer, are formed on a portion of the surface of the Si strained lattice semiconductor layer 2, as by conventional processing techniques not described herein for brevity.

Figure 3:
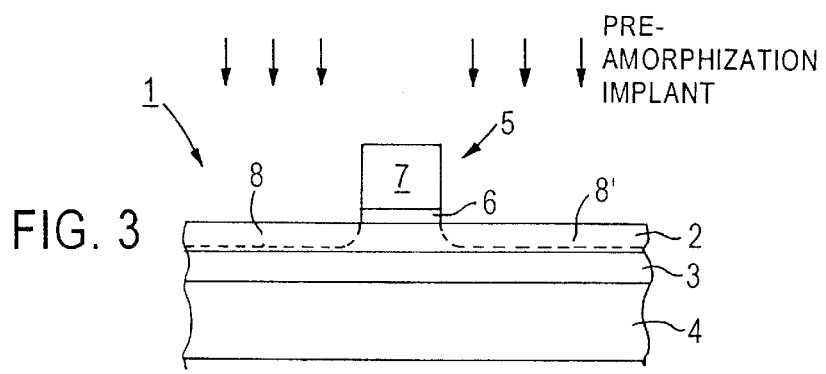

Referring now to FIG. 3, in the next steps according to the inventive methodology, the thus-prepared substrate/workpiece 1 with gate layer stack 5 formed thereon is subjected to a shallow pre-amorphization implant process utilizing the gate layer stack 5 as an implantation mask, to selectively form shallow pre-amorphized regions 8, 8' in the exposed regions of the Si strained lattice semiconductor layer 2, for reducing ion implantation channeling effects associated with the manufacture of a FET transistor in substrate/workpiece 1. In the illustrated embodiment, shallow implant regions 8, 8' extend for about 10–15 nm below the top surface of strained lattice layer 2 and comprise amorphous Si. formed by implanting ions therein, e.g., Si, Ge, or Xe ions, at implantation energies in the range from about 10 to about 100 KeV.

Figure 4:
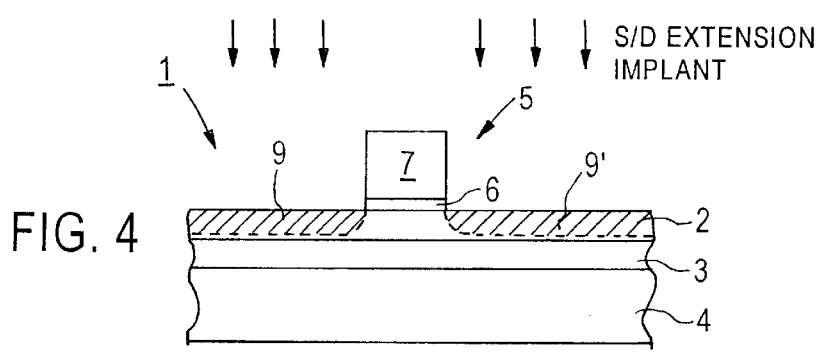

As next shown in FIG. 4, substrate/workpiece 1 with shallow pre-amorphized regions 8, 8' formed therein is then subjected to a dopant implantation process utilizing the gate layer stack 5 as an implantation mask, to selectively form shallow doped source/drain extension regions 9, 9' in the exposed regions of the Si strained lattice semiconductor layer 2, which shallow doped source/drain extension regions 9, 9' extend beneath respective lateral edges of the gate layer stack 5 and beneath the top surface of layer 2 to a depth just above the interface with the Si—Ge buffer layer 3 (typically 30 nm or less below the surface of the Si strained lattice layer 2). The dopant species may be n- or p-type, depending upon whether an NMOS or PMOS transistor is to be formed. Implantation may be performed at a dosage of about $10^{13}$ da/cm$^2$ and suitable dopant species include Sb, As, B, In, or P-containing ions.

Figure 5:
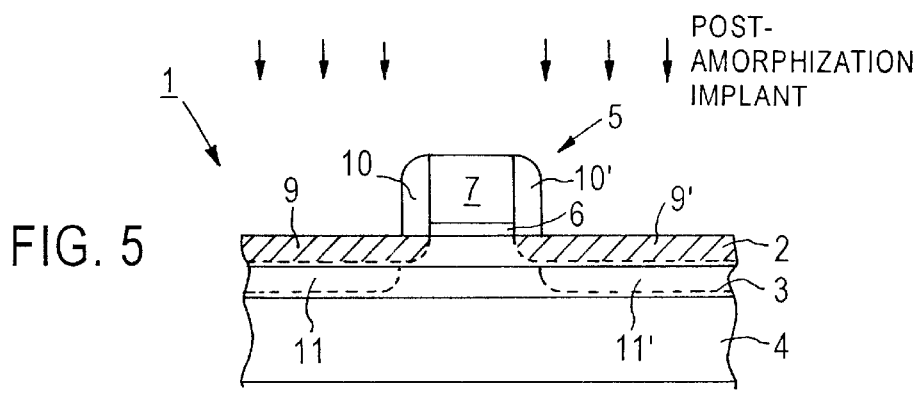

With reference to FIG. 5, according to the next step of the inventive methodology, insulative sidewall spacers 9, 9' are formed on the opposite side edges of the gate layer stack 5, as by conventional blanket insulative layer deposition+anisotropic etching techniques (not described herein in detail for brevity), and the resultant substrate/workpiece 1 is then subjected to a deep post-amorphization implantation process utilizing the gate layer stack 5+sidewall spacers 10, 10' as an implantation mask, to selectively form relatively deeper, post-amorphized regions 11, 11' in the portions of the Si—Ge buffer layer 3 beneath the exposed regions of the Si strained lattice semiconductor layer 2, for gettering point defects generated during the previous ion implantation process for forming source/drain extension regions 9, 9' and create vacancies for compensating for interstitials created during dopant implantation, thereby reducing defect density and transient enhanced diffusion (TED) and facilitating formation of ultra-shallow source/drain extension junctions. The post-amorphization regions 11, 11' are amorphous Si—Ge regions formed in substrate/workpiece 1 to extend for a depth into the Si—Ge buffer layer 3, e.g., by implantation of Si, Ge, or Xe ions of sufficient energy to a depth from about 150 to about 200 nm below the surface of layer 2.

Figure 6:
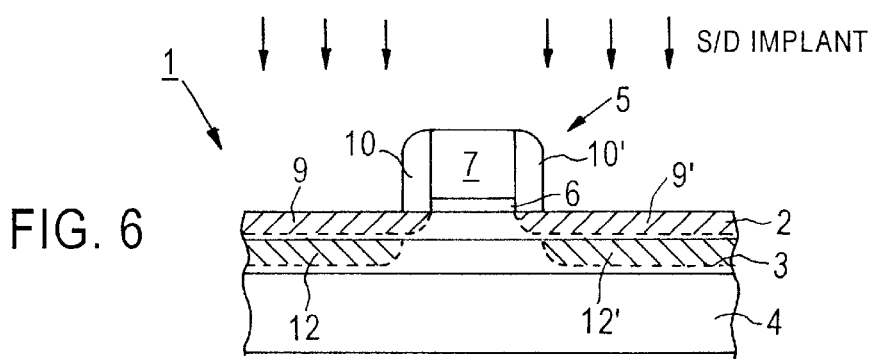

Referring now to FIG. 6, the resultant substrate/workpiece 1 with post-amorphization regions 11, 11' of amorphous Si—Ge formed in the Si—Ge buffer layer 3 is then subjected to a deep dopant implantation process utilizing the gate layer stack 5 plus sidewall spacers 10, 10' as an implantation mask, to selectively form relatively deeper, dopant-implanted source/drain regions 12, 12' in the portions of the Si—Ge buffer layer 3 beneath the exposed regions of the Si strained lattice semiconductor layer 2. As with the post-amorphization regions 11, 11', the relatively deeper, dopant-implanted source/drain regions 12, 12' extend for a depth into the Si—Ge buffer layer 3, and may be formed by, e.g., implantation of 10–100 KeV Sb, As, B, In, or P-containing ions at a dosage of about $1 \times 10^{-13}$ to about $1 \times 10^{14}$ da/cm$^2$ to a depth from about 150 to about 200 nm below the surface of layer 2.

Figure 7:
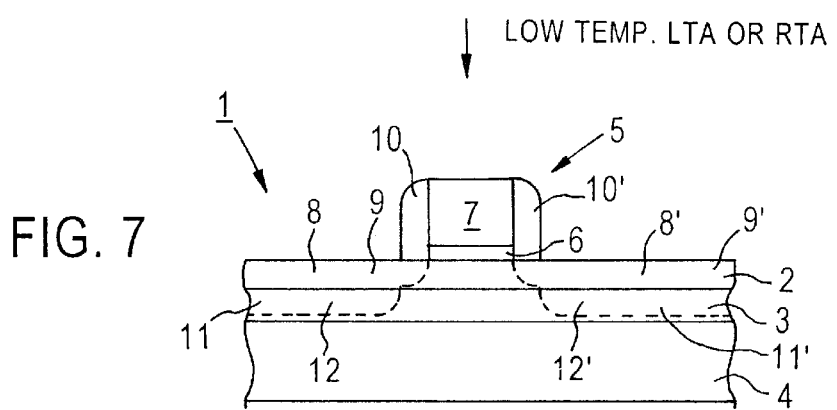

Adverting to FIG. 7, according to the next step of the invention, the thus-formed substrate/workpiece 1 comprising the shallow pre-amorphized regions 7, 7', shallow dopant-implanted source/drain extension regions 9, 9', deep post-amorphized regions 11, 11', and deep dopant-implanted source/drain regions 12, 12' is subjected to laser thermal annealing (LTA) or rapid thermal annealing (RTA) to reform the shallow pre-amorphized regions 8, 8' of layer 2 into strained Si by epitaxial re-crystallization with substantially no, or at least minimal, strain relaxation, and to activate the dopants in the shallow source/drain extension regions 9, 9'. Simultaneously therewith, the deep post-amorphized regions 11, 11' are re-formed by epitaxial re-crystallization and the dopant species in the deep dopant-implanted source/drain regions 12, 12' are activated. In a departure from conventional practices, i.e., wherein the annealing is performed at high temperatures sufficient to effect re-crystallization with substantial relaxation of the tensile stress of the Si strained lattice semiconductor layer 2, e.g., from about 900 to about 1,100° C., according to the inventive methodology, thermal annealing of the substrate/workpiece 1 is performed at a minimum temperature sufficient to effect epitaxial re-crystallization of the amorphized regions of the Si strained lattice semiconductor layer 2 to re-form a strained lattice semiconductor layer having substantially the original amount of lattice strain (prior to amorphization), whereby strain relaxation of said strained lattice semiconductor arising from said thermal annealing is substantially eliminated or minimized. As a consequence, the advantages of increased charge carrier mobility and device operating speed inherent in strained lattice technology are retained in the thermally annealed device structures. By way of illustration, but not limitation, according to the invention, laser thermal annealing (LTA) or rapid thermal annealing (RTA) of the substrate/workpiece of FIG. 7 may be performed at a substantially lower-than-conventional temperature from about 500 to about 600° C. for from about 30 sec. to about 5 hrs. to simultaneously re-crystallize and activate implanted dopant species in each of said amorphous regions in said Si strained lattice semiconductor layer and said Si—Ge layer.

The present invention thus enables reliable formation of high-quality, high operating speed semiconductor devices based upon strained lattice technology, including MOS transistors and CMOS devices. In addition, the inventive methodology enjoys utility in the manufacture of numerous other devices requiring enhanced mobility charge carriers. Moreover, the invention can be practiced by use of conventional methodologies and instrumentalities at rates consistent with the throughput requirements of automated manufacturing processes and is fully compatible with conventional process flow for the manufacture of high-density integration semiconductor devices.

In the previous description, numerous specific details are set forth, such as specific materials, structures, reactants, processes, etc., in order to provide a better understanding of the present invention. However, the present invention can be practiced without resorting to the details specifically set forth. In other instances, well-known processing materials and techniques have not been described in detail in order not to unnecessarily obscure the present invention.

Only the preferred embodiment of the present invention and but a few examples of its versatility are shown and described in the present disclosure. It is to be understood that the present invention is capable of use in various other combinations and environments and is susceptible of changes or modifications within the scope of the inventive concept as expressed herein.

What is claimed is:

1. A method of manufacturing a semiconductor device, comprising steps of:

(a) providing a semiconductor substrate comprising a strained lattice semiconductor layer at an upper surface thereof, said strained lattice semiconductor layer having a pre-selected amount of lattice strain therein;

(b) forming a device structure in said semiconductor substrate by a process which comprises the sequential steps of: forming at least one gate oxide layer/gate electrode stack on at least one surface portion of said strained lattice semiconductor layer; and forming at least one amorphous region in at least one portion of said strained lattice semiconductor layer; and (c) thermal annealing said device structure at a minimum temperature sufficient to effect epitaxial re-crystallization of said at least one amorphous region in said strained lattice semiconductor layer to re-form a strained lattice semiconductor layer having substantially said pre-selected amount of lattice strain, whereby strain relaxation of said strained lattice semiconductor arising from said thermal annealing is substantially eliminated or minimized.

2. The method as in claim 1, wherein:

step (b) further comprises implanting a dopant species in said at least one amorphous region; and step (c) further comprises simultaneously epitaxial re-crystallizing said at least one amorphous region in said strained lattice semiconductor layer and activating the implanted dopant species therein.

3. The method as in claim 2, wherein:

step (a) comprises providing a semiconductor substrate comprising a crystalline semiconductor layer below said strained lattice semiconductor layer;

step (b) still further comprises forming at least one amorphous region in at least one portion of said crystalline semiconductor layer and implanting a dopant species therein; and step (c) still further comprises simultaneously epitaxial re-crystallizing said at least one amorphous region in said strained lattice semiconductor layer and activating the implanted dopant species therein and re-crystallizing said at least one amorphous region in said at least one portion of said crystalline semiconductor layer and activating the implanted dopant species therein.

4. The method as in claim 3, wherein:

step (c) comprises performing laser thermal annealing (LTA) or rapid thermal annealing (RTA).

5. The method as in claim 1, wherein:

step (b) comprises forming a PMOS transistor, an NMOS transistor, or a CMOS device.

6. The method as in claim 5, wherein:

step (a) comprises providing a semiconductor substrate including a crystalline, graded composition silicon-germanium (Si—Ge) layer, with a lattice-matched crystalline silicon (Si) layer on a first side of said Si—Ge layer and comprising said strained lattice semiconductor layer.

7. The method as in claim 6, wherein:

step (a) further comprises providing a semiconductor substrate including a crystalline silicon layer on a second, opposite side of said Si—Ge layer.

8. The method as in claim 6, wherein:

step (b) comprises sequential steps of:
  i. forming at least one gate oxide layer/gate electrode stack on at least one surface portion of said Si strained lattice semiconductor layer;
  ii. performing a pre-amorphization implantation of said Si strained lattice semiconductor layer utilizing said at least one gate oxide layer/gate electrode layer stack as an implantation mask, to form at least one pair of amorphous regions in said Si strained lattice semiconductor layer aligned with opposite side edges of said gate oxide layer/gate electrode layer stack; and
  ii. implanting dopant species of one conductivity type in said at least one pair of amorphous regions in said Si strained lattice semiconductor layer utilizing said gate oxide layer/gate electrode layer stack as an implantation mask; and step (c) comprises thermal annealing said device structure to simultaneously re-crystallize said at least one pair of amorphous regions in said Si strained lattice semiconductor layer and activate the implanted dopant species therein.

9. The method as in claim 8, wherein:

step (a) comprises providing a semiconductor substrate with a said Si strained lattice semiconductor layer having a pre-selected thickness; and steps (b) and (c) together form at least one pair of source/drain extension regions vertically aligned with side edges of said gate oxide layer/gate electrode layer stack and extending in said Si strained lattice semiconductor layer to a depth above and proximate an interface between said Si strained lattice semiconductor layer and said graded composition Si—Ge layer.

10. The method as in claim 8, wherein:

step (b) further comprises sequential steps of:
  iv. forming sidewall spacers on opposite side edge surfaces of said at least one gate oxide layer/gate electrode layer stack;
  v. performing a post-amorphization implantation of said Si—Ge layer utilizing said at least one gate oxide layer/gate electrode layer stack with said sidewall spacers thereon as an implantation mask, to form at least one pair of amorphous regions in said Si—Ge layer; and
  vi. implanting dopant species of said one conductivity type in said at least one pair of amorphous regions in said Si—Ge layer utilizing said at least one gate oxide layer/gate electrode layer stack with said sidewall spacers thereon as an implantation mask; and step (c) further comprises thermal annealing said device structure to simultaneously epitaxial re-crystallize said at least one pair of amorphous regions in said Si strained lattice semiconductor layer and activate the implanted dopant species therein, and to re-crystallize said at least one pair of amorphous regions in said Si—Ge layer and activate the implanted dopant species therein.

11. The method as in claim 10, wherein:

steps (b) and (c) together further form at least one pair of source/drain regions vertically aligned with said sidewall spacers on said side edges of said gate oxide layer/gate electrode layer stack and extending to a pre-selected depth in said Si—Ge layer.

12. The method as in claim 11, wherein:

step (c) comprises performing laser thermal annealing (LTA) or rapid thermal annealing (RTA) at a temperature from about 500 to about 600° C. for from about 30 sec. to about 5 hrs. to simultaneously re-crystallize and activate implanted dopant species in each of said amorphous regions in said Si strained lattice semiconductor layer and said Si—Ge layer.

* * * * *